United States Patent [19]

Vittoria

[11] Patent Number: 5,227,204
[45] Date of Patent: Jul. 13, 1993

[54] FABRICATION OF FERRITE FILMS USING LASER DEPOSITION

[75] Inventor: Carmine Vittoria, Newton, Mass.

[73] Assignee: Northeastern University, Boston, Mass.

[21] Appl. No.: 750,626

[22] Filed: Aug. 27, 1991

[51] Int. Cl.$^5$ ............................ B05D 3/06; B05D 5/12
[52] U.S. Cl. ................................... 427/596; 427/561;
427/126.6; 427/126.3; 427/128
[58] Field of Search ................ 427/42, 53.1, 128, 129, 427/130, 131, 126.2, 126.3, 126.6, 561, 596, 597

[56] References Cited

U.S. PATENT DOCUMENTS

| | | | |
|---|---|---|---|
| 3,585,536 | 6/1971 | Braginski et al. | 333/31 |
| 3,617,381 | 11/1971 | Hanak | 117/235 |
| 3,634,933 | 1/1972 | Hanak | 29/603 |
| 3,710,438 | 1/1973 | Max et al. | 29/603 |
| 4,095,199 | 6/1978 | Behn et al. | 333/70 R |
| 4,170,032 | 10/1979 | Yokoyama et al. | 360/120 |
| 4,238,215 | 12/1980 | Yokoyama et al. | 65/43 |
| 4,281,030 | 7/1981 | Silfuast | 427/53.1 |
| 4,324,854 | 4/1982 | Beauchamp et al. | 430/296 |
| 4,427,723 | 1/1984 | Swain | 427/53.1 |
| 4,451,521 | 5/1984 | Kaule et al. | 428/199 |
| 4,457,972 | 7/1984 | Griffith et al. | 428/334 |
| 4,477,319 | 10/1984 | Abe et al. | 204/56 R |
| 4,579,594 | 4/1986 | Nanao et al. | 106/287.24 |
| 4,586,092 | 4/1986 | Martens et al. | 360/59 |
| 4,691,983 | 9/1987 | Kobayashi et al. | 350/96.12 |
| 4,701,592 | 10/1987 | Cheung | 427/53.1 |
| 4,717,584 | 1/1988 | Aoki et al. | 427/38 |
| 4,726,988 | 2/1988 | Oka et al. | 428/307.3 |
| 4,769,549 | 9/1988 | Tsuchino et al. | 250/484.1 |
| 4,816,292 | 3/1989 | Machida | 427/38 |
| 4,888,211 | 12/1989 | Oka et al. | 427/130 |
| 4,908,226 | 3/1990 | Kubena et al. | 427/38 |
| 4,918,409 | 4/1990 | Lamberty | 333/1.1 |
| 4,948,460 | 8/1990 | Sandaiji et al. | 156/630 |
| 4,960,651 | 10/1990 | Pettigrew et al. | 428/607 |
| 4,975,324 | 12/1990 | Torii et al. | 428/329 |
| 4,982,302 | 1/1991 | Kitamoto et al. | 360/134 |
| 5,015,492 | 5/1991 | Venkatesan et al. | 427/53.1 |
| 5,049,405 | 9/1991 | Cheung | 427/53.1 |
| 5,080,753 | 1/1992 | Doll et al. | 427/53.1 |
| 5,084,300 | 1/1992 | Zander et al. | 427/53.1 |
| 5,096,740 | 3/1992 | Nakagama et al. | 427/53.1 |
| 5,168,097 | 12/1992 | Araya et al. | 427/596 |

Primary Examiner—Marianne Padgett
Attorney, Agent, or Firm—Weingarten, Schurgin, Gagnebin & Hayes

[57] ABSTRACT

A method is provided for fabricating a thin film of ferrite material upon a variety of substrates wherein pulsed high power laser light impinges upon a target of ferrite material causing localized vaporization of the ferrite material and subsequent deposition upon a proximate substrate. The rapidity with which the target material is vaporized promotes chemical stability during ferrite film growth. Both the target and the substrate are maintained inside a vacuum chamber, and are maintained substantially within a temperature range of 550°–600° C. The equipment needed to practice the method is relatively inexpensive. Furthermore, the method allows for the large-scale production of high quality ferrite films with preferential magnetic texture, wherein the magnetization of the ferrite material aligns in a preferred direction in the plane of the film.

12 Claims, 2 Drawing Sheets

FABRICATION OF FERRITE FILMS USING LASER DEPOSITION

FIELD OF THE INVENTION

This invention relates to a method for the fabrication of ferrite films.

BACKGROUND OF THE INVENTION

It is known to fabricate ferrite films using a technique called liquid phase epitaxy. In this technique, a substrate is dipped into a molten liquid flux of ferrite material. However, the substrate must be of high purity and regularity, requiring the use of single crystal material. Also, due to the high cost of the equipment used, this approach is expensive.

RF sputtering is an alternative method for fabricating ferrite films wherein a beam of ions, e.g., argon ions, impinge upon a target of ferrite material. Evaporation of ferrite material is thereby induced, being subsequently deposited upon a nearby substrate. However, the yield rate of good quality ferrite films is quite low.

Another technique involves spinning a substrate while spraying ferrite particles upon the substrate. Relatively poor quality films result.

SUMMARY OF THE INVENTION

A method for fabricating a thin film of ferrite material upon a variety of substrates is provided wherein pulsed high power laser light impinges upon a target of ferrite material causing localized vaporization and subsequent deposition upon a proximate substrate. The rapidity with which the target material is vaporized promotes chemical stability during film growth. Useful substrate materials include semiconductors, glasses, ceramics, and metals. A particularly useful substrate materials include magnesium oxide (MgO) and strontium gallium oxide ($SrGa_{12}O_{19}$). Both the target and the substrate are maintained inside a vacuum chamber, where the pressure is preferably maintained at approximately 100-300 millitorr. Also, the target and the substrate are maintained within a temperature range of 550°-600° C. A heated substrate promotes the growth of hexagonal ferrites, for example, wherein the C-axis of a hexagonal ferrite is oriented perpendicularly to the surface of the film.

The method allows the use of practically any type of substrate material, so long as the surface of the substrate is smooth, i.e., with a surface roughness measure of no more than about 100 Å. Also, the equipment needed to practice the method is relatively inexpensive. Furthermore, the method allows for the large-scale production of high quality ferrite films with preferential magnetic texture. Such high quality ferrite films have commercial application in microwave devices involving non-reciprocal applications, including isolators, circulators, switches, filters, modulators, and limiters. Additionally, the invention provides a technique for growing hexagonal, spinel and garnet ferrites.

DESCRIPTION OF THE DRAWING

The invention will be more fully understood from the following detailed description, in conjunction with the accompanying figures, in which.

DETAILED DESCRIPTION OF THE INVENTION

Figure 1:
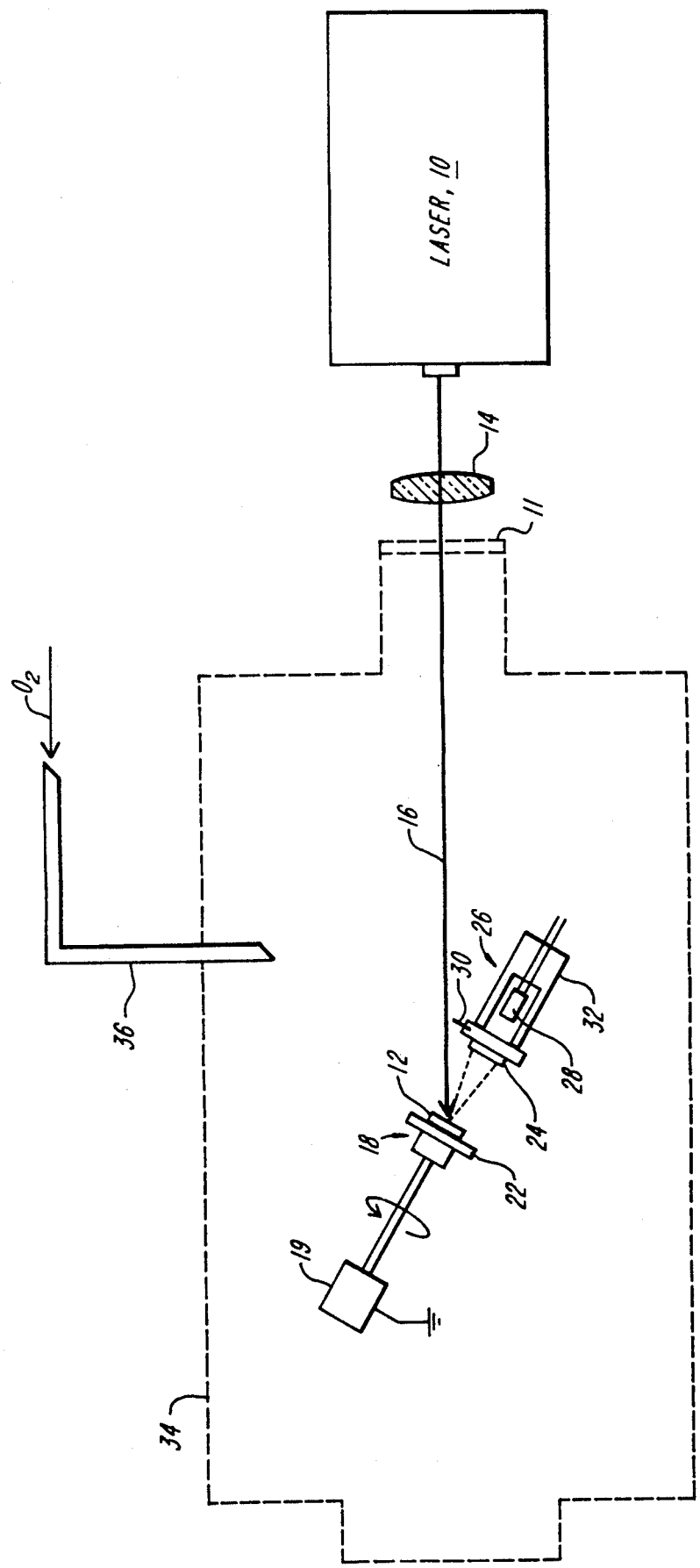
FIG. 1 is a schematic diagram of a deposition system for practicing the method of the invention.

With reference to FIG. 1, a high power pulsed laser 10, such as a LAMBDA PHYSIK Model EMG 103 excimer laser, is directed through a quartz window 11 and towards a flat, cylindrical target pellet 12 of ferrite material to be vaporized. The laser 10 produces a pulse train at a rate of 4 Hz, wherein each pulse imparts 250 mJ of laser energy at a wavelength of 248 nm, and at an energy density of approximately 2 J/cm. In a preferred embodiment, a lens 14 is interposed between the laser 10 and the target pellet 12 to further focus and collimate a beam of light 16 produced by the laser 10. The lens has, for example, a 50 cm focal length.

The pellet 12 is thermally mounted upon a chuck assembly 18 which is electrically grounded. Also, the chuck assembly 18 is driven by a motor 19 into rotation about a central axis 20 at a rate of, for example, 0.05 revolutions per second. In this embodiment, the normal to the surface of the pellet 12 is inclined by 45° with respect to the axis of rotation of the chuck assembly 18.

When a pulse of laser light impinges upon the pellet 12, ferrite material vaporizes, consequently moving towards a substrate 24 and being deposited thereon. The substrate 24 is maintained within a temperature range in accordance with the type of substrate material used, and the type of ferrite to be grown upon the substrate. The substrate 24 is maintained at a distance of approximately 3 cm from the pellet 12 by a substrate holder assembly 26. The substrate holder assembly 26 is electrically isolated. The substrate is maintained within a particular temperature range by means of electrical heaters 30 attached to the block holding the substrate. The temperature is controlled using a temperature measuring device, such as a thermocouple 28. Typically, the holder assembly 26 is maintained at a temperature of 600° C. Additionally, the substrate holder assembly 26 includes a radiation shield 32 to protect the substrate from the effects of ambient ionizing radiation.

The assembly 18, the pellet 12, the substrate 24, and the substrate holder assembly 26 reside within a vacuum chamber 34 which is maintained at a pressure of approximately $4 \times 10^{-8}$ torr prior to vaporization and deposition of the ferrite material upon the substrate 24. The partial pressure of oxygen is maintained at about 300 mtorr using a controlled flow of oxygen via tube 36 into the vacuum chamber 34. Thin films (approximately 500 nm) of exclusively c-axis oriented $BaFe_{12}O_{19}$ can be deposited in situ in less than 30 minutes.

Figure 2:
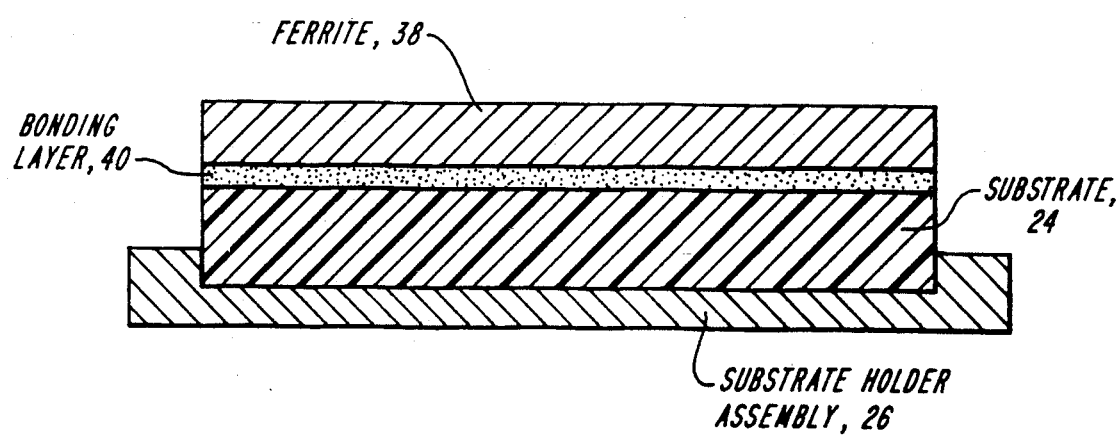
FIG. 2 is a diagrammatic, exaggerated cut-away side view of a ferrite thin film fabricated on a substrate by the method of the invention.

More particularly, for example, referring to FIG. 2, to form a film of barium ferrite ($BaFe_{12}O_{19}$) 38, a magnesium oxide (MgO) or sapphire or $SrGa_{12}O_{19}$ substrate 24 is used. The substrate 24 is maintained within a temperature range of 550°-600° C. If the temperature is not kept generally within this range, the film will tend to include multi-phase structures, such as spinels and other materials of ferrite hexagonal composition. In a preferred embodiment of the method of the invention, an intermediate bonding layer 40 can be used to promote adhesion of the ferrite layer 38 to the substrate 24, as well as to promote desirable crystalline structure. In this instance, manganese ferrite ($MnFe_2O_4$) can aid in the growth of the Barium ferrite film layer 38.

To obtain cubic ferrites, such as the spinel ($A_2O_4$) and garnet ($B_3C_5O_{12}$) ferrites, where A represents a transition metal ion, B represents a rare earth ion, and C represents a transition metal ion, the substrate 24 consists essentially of MgO maintained at a temperature generally with the range of 500°–950° C. The lower end of this temperature range corresponds to the transition temperature between the amorphous and crystalline phases, and the upper end of the range corresponds to the temperature that is associated with significant ionic diffusion between the substrate and the ferrite film. Since films of high purity are desired, ionic diffusion is to be avoided.

To form hexagonal films, a substrate with a hexagonal lattice structure is used. For example, if hexagonal barium ferrite is desired, $SrGa_{12}O_{19}$, having a hexagonal structure, is preferable. Analogously, to form a film with a cubic lattice structure, a cubic substrate, such as MgO is used.

Other modifications and implementations will occur to those skilled in the art without departing from the spirit and the scope of the invention as claimed. Accordingly, the above description is not intended to limit the invention except as indicated in the following claims.

What is claimed is:

1. A method for forming crystalline ferrite films comprising the steps of:
   choosing a substrate that consists essentially of a material selected from the group consisting of magnesium oxide, sapphire, $SrGa_{12}O_{19}$, and $MnFe_2O_4$;
   enclosing within a vacuum chamber both a ferrite target and the substrate, upon which substrate a ferrite film is to be formed;
   heating said substrate to a temperature generally within the range of 500° C. to 950° C.;
   maintaining a flow of oxygen in the vicinity of the substrate; and
   directing laser light towards said ferrite target to initiate rapid vaporization of at least a portion of said ferrite target, and subsequent deposition of ferrite material upon said substrate to form a crystalline ferrite film.

2. The method of claim 1 wherein said flow of oxygen within the vacuum chamber maintains a partial pressure of oxygen of approximately 300 mtorr in the vicinity of the substrate during formation of said ferrite film.

3. The method of claim 1 wherein said ferrite target is disposed at a distance from said substrate, the distance chosen so as to promote deposition of ferrite material upon said substrate.

4. The method of claim 1 wherein said ferrite target is rotated during the step of firing said laser.

5. The method of claim 1 wherein said laser is directed obliquely at said ferrite target.

6. The method of claim 1 wherein said laser is a pulsed laser of a power sufficient to vaporize at least said portion of said ferrite target.

7. The method of claim 1 wherein said laser is focused by an intervening lens.

8. The method of claim 1 wherein said target is electrically grounded.

9. The method of claim 1 wherein said substrate has been precoated with an intermediate bonding layer to promote enhanced adhesion and crystal structure of a ferrite film to be formed.

10. The method of claim 1 wherein after said ferrite film has been formed, the film is bathed in oxygen gas at room temperature and pressure.

11. The method of claim 1 wherein said substrate is radiantly heated.

12. The method of claim 1 wherein said substrate is shielded from ionizing radiation.

* * * * *